(12) United States Patent
Bedell et al.

(10) Patent No.: US 10,833,175 B2
(45) Date of Patent: Nov. 10, 2020

(54) FORMATION OF DISLOCATION-FREE SIGE FINFET USING POROUS SILICON

(71) Applicant: INTERNATIONAL BUSINESS MACHINES CORPORATION, Armonk, NY (US)

(72) Inventors: Stephen W. Bedell, Wappingers Falls, NY (US); Kangguo Cheng, Schenectady, NY (US); Jeehwan Kim, Los Angeles, CA (US); Alexander Reznicek, Troy, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 134 days.

(21) Appl. No.: 14/730,895

(22) Filed: Jun. 4, 2015

(65) Prior Publication Data

US 2016/0359044 A1 Dec. 8, 2016

(51) Int. Cl.
| | |
|---|---|
| *H01L 21/02* | (2006.01) |
| *H01L 29/66* | (2006.01) |
| *H01L 29/78* | (2006.01) |
| *H01L 21/306* | (2006.01) |
| *H01L 29/10* | (2006.01) |

(Continued)

(52) U.S. Cl.
CPC ...... *H01L 29/66795* (2013.01); *H01L 21/306* (2013.01); *H01L 29/1054* (2013.01); *H01L 29/785* (2013.01); *H01L 29/7842* (2013.01); *H01L 21/3247* (2013.01); *H01L 29/165* (2013.01)

(58) Field of Classification Search
CPC ..... H01L 21/823431; H01L 21/823821; H01L 21/845; H01L 27/0886; H01L 27/0924
USPC .......................................................... 257/192
See application file for complete search history.

(56) References Cited

U.S. PATENT DOCUMENTS

| | | | | |
|---|---|---|---|---|
| 5,359,214 A | * | 10/1994 | Kurtz | H01L 29/1066 257/263 |
| 5,360,759 A | * | 11/1994 | Stengl | H01L 21/306 257/E21.215 |

(Continued)

FOREIGN PATENT DOCUMENTS

| | | |
|---|---|---|
| JP | 61292935 A | 12/1986 |
| JP | 62108539 A | 5/1987 |

(Continued)

OTHER PUBLICATIONS

Franco et al., "NBTI in Si0.55Ge0.45 cladding p-FinFETs: porting the superior reliability from planar to 3D architectures", IEEE (2015) pp. 2F.4.1-2F.4.5.*

(Continued)

*Primary Examiner* — Jay C Kim
(74) *Attorney, Agent, or Firm* — Tutunjian & Bitetto, P.C.; Erik Johnson

(57) ABSTRACT

A semiconductor device that includes a fin structure having a porous core, and a relaxed semiconductor layer present on the porous core. The semiconductor device may further include a strained semiconductor layer that is substantially free of defects that is present on the strained semiconductor layer. A gate structure may be present on a channel region of the fin structure, and source and drain regions may be present on opposing sides of the gate structure.

8 Claims, 8 Drawing Sheets

(51) Int. Cl.
*H01L 29/165* (2006.01)
*H01L 21/324* (2006.01)

(56) References Cited

U.S. PATENT DOCUMENTS

| | | | | |
|---|---|---|---|---|
| 5,482,877 A * | 1/1996 | Rhee | H01L 29/42384 | 438/157 |
| 5,529,950 A * | 6/1996 | Hoenlein | H01L 21/76898 | 205/656 |
| 5,679,475 A * | 10/1997 | Yamagata | H01L 21/30604 | 257/E21.219 |
| 5,685,946 A * | 11/1997 | Fathauer | B82Y 10/00 | 148/33.4 |
| 5,840,590 A * | 11/1998 | Myers, Jr. | H01L 21/26506 | 438/471 |
| 5,900,652 A * | 5/1999 | Battaglia | H01L 21/221 | 257/135 |
| 5,914,183 A * | 6/1999 | Canham | B82Y 10/00 | 205/656 |
| 5,972,758 A * | 10/1999 | Liang | H01L 21/762 | 257/E21.433 |
| 6,136,684 A * | 10/2000 | Sato | H01L 21/76256 | 257/E21.102 |
| 6,143,629 A * | 11/2000 | Sato | H01L 21/76262 | 257/758 |
| 6,228,694 B1 * | 5/2001 | Doyle | H01L 21/26506 | 438/199 |
| 6,285,072 B1 * | 9/2001 | Maeda | H01L 21/7624 | 257/370 |
| 6,316,333 B1 * | 11/2001 | Bruel | H01L 29/66772 | 257/E21.415 |
| 6,376,859 B1 * | 4/2002 | Swanson | H01L 21/02203 | 257/49 |
| 6,459,123 B1 * | 10/2002 | Enders | H01L 21/82388 | 257/331 |
| 6,479,365 B2 * | 11/2002 | Lee | B82Y 10/00 | 257/9 |
| 6,551,944 B1 * | 4/2003 | Fallica | H01L 21/76232 | 148/33.2 |
| 6,562,703 B1 * | 5/2003 | Maa | H01L 21/02381 | 257/55 |
| 6,570,217 B1 * | 5/2003 | Sato | H01L 21/324 | 257/327 |
| 6,593,211 B2 * | 7/2003 | Sato | H01L 21/76259 | 257/758 |
| 6,593,625 B2 * | 7/2003 | Christiansen | H01L 21/02378 | 257/12 |
| 6,645,833 B2 * | 11/2003 | Brendel | H01L 21/76259 | 257/E21.57 |
| 6,656,822 B2 * | 12/2003 | Doyle | H01L 21/31155 | 257/E21.248 |
| 6,717,212 B2 * | 4/2004 | Ju | H01L 21/76254 | 257/347 |
| 6,740,913 B2 * | 5/2004 | Doyle | H01L 21/26506 | 257/288 |
| 6,774,435 B1 * | 8/2004 | Matsumoto | H01L 21/3226 | 257/347 |
| 6,803,270 B2 * | 10/2004 | Dokumachi | H01L 21/82380 | 257/E21.633 |
| 6,812,116 B2 * | 11/2004 | Huang | H01L 21/02381 | 257/347 |
| 6,828,632 B2 * | 12/2004 | Bhattacharyya | H01L 21/84 | 257/288 |
| 6,858,918 B2 * | 2/2005 | Maeda | H01L 21/84 | 257/312 |
| 6,878,978 B2 * | 4/2005 | Dokumaci | H01L 21/82380 | 257/204 |
| 6,929,984 B2 * | 8/2005 | Forbes | H01L 21/3223 | 257/E21.319 |
| 6,951,783 B2 * | 10/2005 | Mathew | H01L 21/823437 | 257/E21.621 |
| 6,972,461 B1 * | 12/2005 | Chen | H01L 29/66795 | 257/192 |
| 6,974,983 B1 * | 12/2005 | Hill | H01L 21/845 | 257/292 |
| 6,995,430 B2 * | 2/2006 | Langdo | H01L 21/28518 | 257/352 |
| 7,033,868 B2 * | 4/2006 | Nakamura | H01L 29/66772 | 257/E21.415 |
| 7,052,948 B2 * | 5/2006 | Murphy | H01L 21/3223 | 257/347 |
| 7,064,022 B1 * | 6/2006 | Hill | H01L 21/845 | 257/E21.345 |
| 7,125,458 B2 * | 10/2006 | Bedell | C22F 1/10 | 148/239 |
| 7,142,577 B2 * | 11/2006 | Geusic | G02B 5/0883 | 372/99 |
| 7,154,118 B2 * | 12/2006 | Lindert | H01L 29/66795 | 257/18 |
| 7,157,765 B2 * | 1/2007 | Maeda | H01L 21/26586 | 257/213 |
| 7,164,183 B2 * | 1/2007 | Sakaguchi | H01L 29/66795 | 257/478 |
| 7,193,256 B2 * | 3/2007 | Renna | B81C 1/00047 | 257/288 |
| 7,193,279 B2 * | 3/2007 | Doyle | H01L 29/66795 | 257/19 |
| 7,198,990 B2 * | 4/2007 | Joshi | H01L 21/84 | 257/903 |
| 7,253,479 B2 * | 8/2007 | Sugaya | H01L 21/76286 | 257/347 |
| 7,256,077 B2 * | 8/2007 | Orlowski | H01L 29/42392 | 257/E21.415 |
| 7,279,404 B2 | 10/2007 | Halimaoui et al. | | |
| 7,304,336 B2 * | 12/2007 | Cheng | H01L 29/66795 | 257/288 |
| 7,323,710 B2 * | 1/2008 | Kim | H01L 29/66795 | 257/19 |
| 7,332,412 B2 * | 2/2008 | Park | H01L 21/32134 | 257/19 |
| 7,335,545 B2 * | 2/2008 | Currie | H01L 21/76254 | 257/E21.121 |
| 7,348,186 B2 * | 3/2008 | Yoshida | H01L 29/1054 | 438/14 |
| 7,348,284 B2 * | 3/2008 | Doyle | H01L 21/845 | 257/E21.633 |
| 7,365,399 B2 * | 4/2008 | de Souza | H01L 21/0203 | 257/368 |
| 7,372,086 B2 * | 5/2008 | Sato | H01L 21/3247 | 257/250 |
| 7,485,520 B2 * | 2/2009 | Zhu | H01L 29/66795 | 257/E21.301 |
| 7,494,906 B2 * | 2/2009 | Kammler | H01L 21/26506 | 438/528 |
| 7,560,344 B2 * | 7/2009 | Kim | H01L 21/28273 | 257/276 |
| 7,560,358 B1 * | 7/2009 | Kim | H01L 21/823828 | 257/E21.085 |
| 7,589,995 B2 * | 9/2009 | Tang | H01L 27/108 | 257/E27.091 |
| 7,605,443 B2 * | 10/2009 | Ogura | H01L 21/26533 | 257/522 |
| 7,622,761 B2 * | 11/2009 | Park | H01L 21/764 | 257/314 |
| 7,633,099 B2 * | 12/2009 | Hashimoto | H01L 27/10873 | 257/213 |
| 7,638,381 B2 * | 12/2009 | Cheng | H01L 29/785 | 438/157 |
| 7,642,179 B2 * | 1/2010 | Ikeda | H01L 21/02381 | 438/488 |
| 7,655,989 B2 * | 2/2010 | Zhu | H01L 21/845 | 257/288 |
| 7,700,449 B2 * | 4/2010 | Lee | H01L 21/823431 | 257/350 |
| 7,718,469 B2 * | 5/2010 | Hasan | C30B 25/18 | 257/E21.102 |
| 7,767,560 B2 * | 8/2010 | Jin | B82Y 10/00 | 257/E21.103 |

(56) References Cited

U.S. PATENT DOCUMENTS

| | | | | |
|---|---|---|---|---|
| 7,781,771 B2* | 8/2010 | Lindert | H01L 29/66795 | 257/17 |
| 7,795,679 B2* | 9/2010 | Cannon | H01L 29/0653 | 257/347 |
| 7,803,695 B2* | 9/2010 | Dantz | H01L 21/187 | 257/E21.122 |
| 7,825,016 B2* | 11/2010 | Giles | H01L 21/26506 | 438/528 |
| 7,829,932 B2* | 11/2010 | Song | H01L 21/76897 | 257/315 |
| 7,833,873 B2 | 11/2010 | Greene et al. | | |
| 7,833,884 B2* | 11/2010 | Bedell | H01L 21/02126 | 438/479 |
| 7,868,374 B2* | 1/2011 | Cheng | H01L 27/108 | 257/296 |
| 7,872,302 B2* | 1/2011 | Kim | H01L 29/66666 | 257/329 |
| 7,887,634 B2* | 2/2011 | Giles | H01L 21/26506 | 117/84 |
| 7,928,426 B2* | 4/2011 | Chui | H01L 29/1054 | 257/24 |
| 7,960,794 B2* | 6/2011 | Doyle | H01L 21/845 | 257/369 |
| 8,021,949 B2* | 9/2011 | Cheng | H01L 29/66803 | 257/220 |
| 8,030,634 B2* | 10/2011 | Lung | H01L 27/24 | 257/2 |
| 8,076,231 B2* | 12/2011 | Saitoh | H01L 21/823821 | 257/347 |
| 8,106,468 B2* | 1/2012 | Wang | H01L 29/0649 | 257/276 |
| 8,227,857 B2* | 7/2012 | Goarin | H01L 21/3247 | 257/331 |
| 8,357,995 B2* | 1/2013 | Giles | H01L 21/26506 | 257/610 |
| 8,440,517 B2* | 5/2013 | Lin | H01L 29/66795 | 257/E21.224 |
| 8,492,235 B2* | 7/2013 | Toh | H01L 29/66795 | 257/E29.022 |
| 8,497,177 B1* | 7/2013 | Chang | H01L 29/66795 | 438/283 |
| 8,592,295 B2* | 11/2013 | Sleight | H01L 29/66477 | 257/13 |
| 8,629,478 B2* | 1/2014 | Ko | H01L 29/66795 | 257/192 |
| 8,653,610 B2* | 2/2014 | Jagannathan | H01L 27/0924 | 257/407 |
| 8,673,736 B2* | 3/2014 | Yang | H01L 21/76232 | 257/E21.555 |
| 8,674,341 B2* | 3/2014 | Ko | H01L 29/66818 | 257/24 |
| 8,679,906 B2* | 3/2014 | Cheng | H01L 29/66795 | 257/21 |
| 8,691,640 B1* | 4/2014 | LiCausi | H01L 29/66795 | 257/E21.421 |
| 8,697,515 B2* | 4/2014 | Yin | H01L 21/82382 | 257/E21.409 |
| 8,716,080 B2* | 5/2014 | Fumitake | H01L 21/823807 | 257/369 |
| 8,729,638 B2* | 5/2014 | Zhu | H01L 29/66795 | 257/369 |
| 8,759,874 B1* | 6/2014 | Loubet | H01L 29/66795 | 257/192 |
| 8,766,364 B2* | 7/2014 | Doornbos | H01L 21/823807 | 257/351 |
| 8,779,517 B2* | 7/2014 | Lin | H01L 21/823431 | 257/173 |
| 8,785,968 B2* | 7/2014 | Shrivastava | H01L 27/1211 | 257/133 |
| 8,796,695 B2* | 8/2014 | Liao | H01L 29/66484 | 257/190 |
| 8,815,656 B2* | 8/2014 | Adam | H01L 21/02293 | 438/149 |
| 8,847,281 B2* | 9/2014 | Cea | H01L 29/66545 | 257/192 |
| 8,847,324 B2* | 9/2014 | Choi | H01L 29/42376 | 257/192 |
| 8,872,225 B2* | 10/2014 | Chu-Kung | H01L 21/823821 | 257/190 |
| 8,890,103 B2* | 11/2014 | D'Arrigo | H01L 21/02381 | 257/1 |
| 8,890,207 B2* | 11/2014 | Wu | H01L 29/66795 | 257/183 |
| 8,912,602 B2* | 12/2014 | Hsu | H01L 29/66795 | 257/347 |
| 8,921,191 B2* | 12/2014 | Cai | H01L 27/0886 | 438/300 |
| 8,928,086 B2* | 1/2015 | Utomo | H01L 29/7855 | 257/365 |
| 8,941,153 B2* | 1/2015 | Lee | H01L 21/823431 | 257/288 |
| 8,941,155 B2* | 1/2015 | Kang | H01L 29/7851 | 257/288 |
| 8,946,035 B2* | 2/2015 | Huang | H01L 29/66477 | 257/288 |
| 8,956,942 B2* | 2/2015 | Loubet | H01L 21/823431 | 438/164 |
| 8,957,478 B2* | 2/2015 | He | H01L 27/0886 | 257/192 |
| 8,994,125 B2 | 3/2015 | Kanegae | | |
| 9,000,522 B2* | 4/2015 | Cheng | H01L 21/76283 | 257/347 |
| 9,006,077 B2* | 4/2015 | Akarvardar | H01L 21/76264 | 438/156 |
| 9,024,364 B2* | 5/2015 | Okano | H01L 29/42392 | 257/255 |
| 9,024,368 B1* | 5/2015 | Yu | H01L 29/7848 | 257/288 |
| 9,029,835 B2* | 5/2015 | Chu-King | H01L 29/267 | 257/24 |
| 9,034,637 B2* | 5/2015 | Merz | C12Q 1/6869 | 435/283.1 |
| 9,035,430 B2* | 5/2015 | Vega | H01L 21/3081 | 257/192 |
| 9,099,495 B1* | 8/2015 | Nieh | H01L 29/66803 | |
| 9,147,616 B1* | 9/2015 | Jacob | H01L 27/0886 | |
| 9,159,830 B2* | 10/2015 | Giles | H01L 21/26506 | |
| 9,159,831 B2* | 10/2015 | Liu | H01L 29/66795 | |
| 9,166,023 B2* | 10/2015 | Loubet | H01L 29/785 | |
| 9,166,049 B2* | 10/2015 | Loubet | H01L 29/7848 | |
| 9,246,005 B2* | 1/2016 | Basker | H01L 29/7848 | |
| 9,269,814 B2* | 2/2016 | Hsu | H01L 29/785 | |
| 9,312,179 B2* | 4/2016 | Lin | H01L 21/823412 | |
| 9,312,360 B2* | 4/2016 | Cheng | H01L 29/0638 | |
| 9,343,303 B2* | 5/2016 | Wang | H01L 21/0262 | |
| 9,349,867 B2* | 5/2016 | Zhu | H01L 29/6681 | |
| 9,368,408 B2* | 6/2016 | Tegen | H01L 21/823412 | |
| 9,373,550 B2* | 6/2016 | Basker | H01L 21/823418 | |
| 9,379,018 B2* | 6/2016 | Choi | H01L 21/82343 | |
| 9,379,218 B2* | 6/2016 | Cheng | H01L 29/66795 | |
| 9,385,023 B1* | 7/2016 | Cheng | H01L 29/7855 | |
| 9,391,181 B2* | 7/2016 | Chu-Kung | H01L 29/66393 | |
| 9,391,202 B2* | 7/2016 | Park | H01L 29/785 | |
| 9,437,698 B2* | 9/2016 | Wang | H01L 29/42392 | |
| 9,443,769 B2* | 9/2016 | Wang | H01L 21/823481 | |
| 9,455,323 B2* | 9/2016 | Basker | H01L 29/0847 | |
| 9,461,149 B2* | 10/2016 | Li | H01L 29/66795 | |
| 9,484,461 B2* | 11/2016 | Ching | H01L 29/785 | |
| 9,560,765 B2* | 1/2017 | Kautzsch | H05K 1/0284 | |
| 9,577,100 B2* | 2/2017 | Cheng | H01L 29/7851 | |
| 10,032,870 B2* | 7/2018 | de Souza | H01L 29/16 | |
| 2004/0245571 A1* | 12/2004 | Cheng | H01L 21/02378 | 257/347 |
| 2005/0037599 A1 | 2/2005 | Halimaoui et al. | | |
| 2005/0040444 A1* | 2/2005 | Cohen | H01L 21/82341 | 257/288 |
| 2005/0221591 A1* | 10/2005 | Bedell | H01L 21/02381 | 438/479 |

(56) References Cited

U.S. PATENT DOCUMENTS

| | | | |
|---|---|---|---|
| 2006/0027934 A1* | 2/2006 | Edelstein | H01L 21/486 257/774 |
| 2006/0289962 A1 | 12/2006 | Xie | |
| 2007/0085131 A1* | 4/2007 | Matsuo | H01L 29/0657 257/315 |
| 2008/0173937 A1* | 7/2008 | Chung | H01L 29/0657 257/329 |
| 2009/0189189 A1* | 7/2009 | Kamata | H01L 21/28255 257/192 |
| 2013/0146942 A1* | 6/2013 | Zhu | H01L 29/66795 257/190 |
| 2013/0248942 A1* | 9/2013 | Okano | H01L 29/045 257/255 |
| 2013/0337601 A1* | 12/2013 | Kapur | H01L 31/06875 438/93 |
| 2014/0103397 A1* | 4/2014 | Pillarisetty | B82Y 10/00 257/192 |
| 2014/0167162 A1* | 6/2014 | He | H01L 29/66795 257/347 |
| 2014/0239399 A1* | 8/2014 | Nagumo | H01L 29/785 257/347 |
| 2014/0353753 A1* | 12/2014 | Loubet | H01L 29/66795 257/347 |
| 2015/0021697 A1* | 1/2015 | Colinge | H01L 29/7848 257/368 |
| 2015/0093862 A1* | 4/2015 | Nainani | H01L 21/02063 438/197 |
| 2015/0123166 A1* | 5/2015 | Jacob | H01L 29/785 257/192 |
| 2015/0364543 A1* | 12/2015 | Chen | H01L 29/0669 257/412 |
| 2015/0364603 A1* | 12/2015 | Cheng | H01L 29/7851 257/192 |
| 2016/0104765 A1* | 4/2016 | Ching | H01L 21/823431 257/29 |
| 2016/0190239 A1* | 6/2016 | Suk | H01L 29/0649 257/351 |
| 2016/0190302 A1* | 6/2016 | Bedell | H01L 29/785 257/347 |
| 2016/0276226 A1* | 9/2016 | Bedell | H01L 21/845 |

FOREIGN PATENT DOCUMENTS

| | | |
|---|---|---|
| JP | 04012092 A | 1/1992 |
| JP | 05213693 A | 8/1993 |

OTHER PUBLICATIONS

Blanchard et al., "Engineering Pseudosubstrates with Porous Silicon Technology" (2011).*

Bergamaschini et al., "Self-aligned Ge and SiGe three-dimensional epitaxy on dense Si pillar arrays", Surface Science Reports 68 (2013) pp. 390-417.*

Falub et al., "Scaling Hetero-Epitaxy from Layers to Three-Dimensional Crystals", Science 335 (2012) pp. 1330-1334.*

Wood et al., "Fin Doping by Hot Implant for 14nm FinFET Technology", 224th ECS Meeting (2013).*

Ang et al., "300mm FinFET Results Utilizing Conformal, Damage Free, Ultra Shallow Junctions (Xj~5nm) Formed with Molecular Monolayer Doping Technique", IEDM11-837 (2011).*

Xu et al., "Novel 14-nm Scallop-Shaped FinFETs (S-FinFETs) on Bulk-Si Substrate", Nanoscale Research Letters 10 (2015) 249.*

Kambham et al., "Atom-probe for FinFET dopant characterization" Ultramicroscopy 111 (2011) pp. 535-539.*

Franco et al., "NBTI in Si0.55Ge0.45 cladding p-FinFETs: porting the superior reliability from planar to 3D architectures", IEEE 2F.4.1 (2015).*

Linten et al., "ESD in FinFET technologies: past learning and emerging challenges", IEEE 2B.5.1 (2013).*

Cheng et al., "Bottom Oxidation through STI (BOTS)—A Novel Approach to Fabricate Dielectric Isolated FinFETs on Bulk Substrates," 2014 Symposium on VLSI Technology Digest of Technical Papers (2014).*

Franco et al., "NBTI in Si0.55Ge0.45 cladding p-FinFETs: porting the superior reliability from planar to 3D architectures," IEEE, 2F.4.1-2F.4.5 (2015).*

Eriguchi et al., "Effects of straggling of incident ions on plasma-induced damage creation in "fin"-type field-effect transistors," Japanese Journal of Applied Physics 53, 03DE02 (2014).*

Onoda et al., "Heated Ion Implantation Technology for FinFET Application," IEEE (2014).*

Chou et al., "Investigation and Comparison of Work Function Variation for FinFET and UTB SOI Devices Using a Voronoi Approach," IEEE Transactions on Electron Devices (2013).*

Colombeau et al., "Advanced CMOS devices: Challenges and implant solutions," Physica Status Solidi A 211 (2014) pp. 101-108.*

Wood et al., "Fin Doping by Hot Implant for 14nm FinFET Technology and Beyond," The Electrochemical Society (2013).*

* cited by examiner

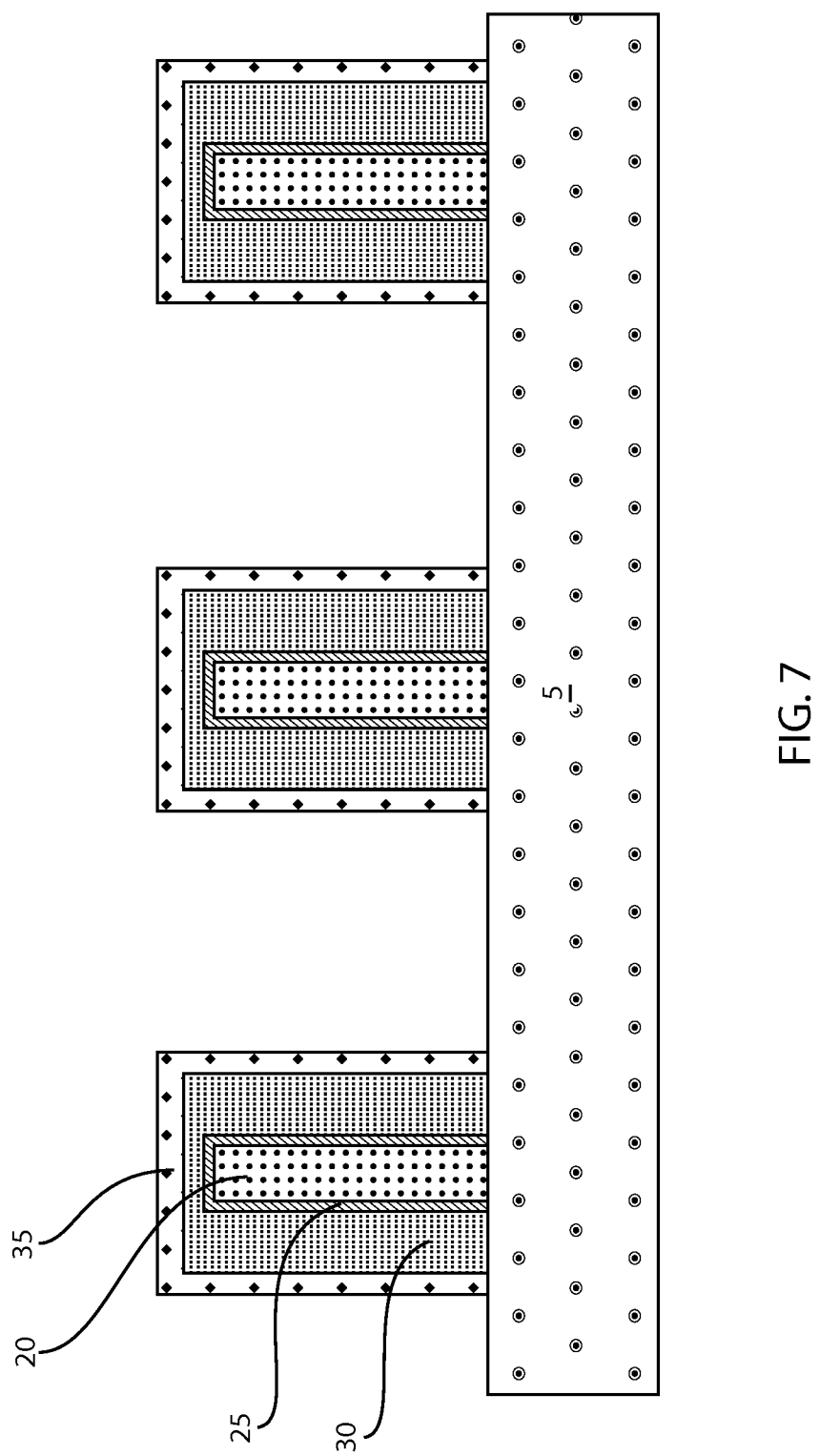

US 10,833,175 B2

FORMATION OF DISLOCATION-FREE SIGE FINFET USING POROUS SILICON

BACKGROUND

Technical Field

The present disclosure relates generally to semiconductor fabrication, and more particularly to structures and methods for forming fin field effect transistors (finFETs).

Description of the Related Art

With the continuing trend towards miniaturization of integrated circuits (ICs), there is a need for transistors to have higher drive currents with increasingly smaller dimensions. The use of non-planar semiconductor devices such as, for example, silicon fin field effect transistors (FinFETs) may be the next step in the evolution of complementary metal oxide semiconductor (CMOS) devices.

SUMMARY

In one aspect of the present disclosure, a semiconductor device including at least one fin structure having a porous core is provided. In one embodiment, the semiconductor device may include a fin structure of semiconductor material comprising a porous core, and a gate structure on a channel region portion of the fin structure. Source and drain regions may be present on opposing sides of the gate structure.

In another embodiment of the present disclosure, a semiconductor device is provided that includes a fin structure having a porous core, a relaxed semiconductor layer present on the porous core, and a strained semiconductor layer that is substantially free of defects that is present on the strained semiconductor layer. A gate structure may be present on a channel region of the fin structure, and source and drain regions may be present on opposing sides of the gate structure.

In another aspect of the present disclosure, a method of forming a semiconductor device may be provided that includes using a porous core of a fin structure to provide a relaxed surface that can be used as the deposition surface for a defect free strained semiconductor layer. In one embodiment, the method may begin with forming porosity in a first composition fin structure, and treating the first semiconductor composition fin structure with an anneal to produce a fin structure with a porous core and a first composition semiconductor outer layer. A second composition semiconductor layer may be formed on the first composition semiconductor outer layer of the fin structure with the porous core. The strain in the second semiconductor composition is relaxed by the elasticity of the porous core. Source and drain regions may be formed on opposing sides of a gate structure that is present on a channel region portion of the fin structure.

BRIEF DESCRIPTION OF DRAWINGS

The disclosure will provide details in the following description of preferred embodiments with reference to the following figures wherein:

FIG. 7 is a side cross-sectional view of another embodiment of the present disclosure in which a third composition strained semiconductor layer that is substantially free of defects is formed on the second composition semiconductor layer.

DETAILED DESCRIPTION OF PREFERRED EMBODIMENTS

Figure 1A:
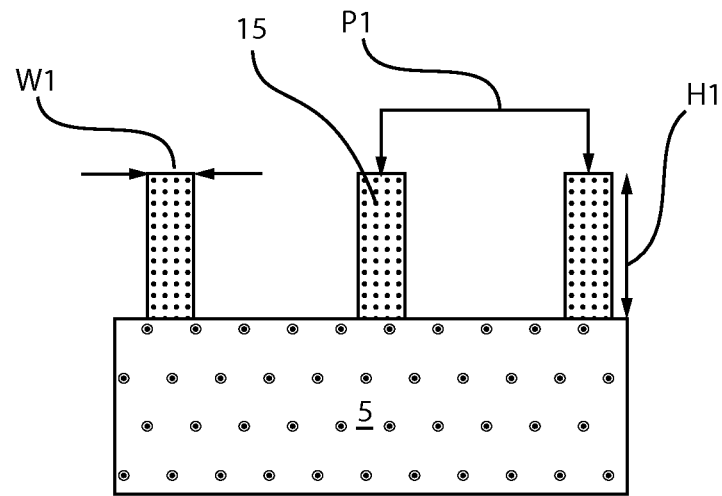
FIG. 1A is a side cross-sectional view of a forming fin structures of a first composition on a substrate, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein provide FinFETs having substantially defect free fin structures. Prior to the present discoveries, forming silicon germanium (SiGe) FinFETs included growth of relaxed silicon germanium (SiGe) including dislocation defects, and patterning the silicon germanium (SiGe) to provide fin structures. To increase strain for carrier speed enhancements, higher germanium (Ge) contents can be required, which in turn typically increases dislocation defect density. The presence of dislocation defect density can limit the suitability of a device. In some embodiments, the methods and structures disclosed herein provide a fin structure composed of silicon having a porous core, wherein the porous core provides a compliant, i.e., elastic, body. It has been determined that the complaint body provided by the porous core of the fin structure allows for relaxation of silicon germanium (SiGe) that is deposited on the fin structure. For example, the elastic modulus of porous silicon (Si) can be several times less than the elastic modulus of silicon germanium (SiGe). In this example, if the thickness of silicon germanium (SiGe) is similar or greater than the thickness of the porous silicon, i.e., the porous silicon that provides the core of the fin structure, the strain within the silicon germanium (SiGe) can be relaxed.

The relaxation phenomenon due to the significant elastic modulus difference between silicon germanium (SiGe) and porous silicon (porous silicon may be referred to as "PS") can be further characterized in accordance with the following equation for the Young's modules of a porous silicon (Si) substrate:

$$E_{PS} = \frac{E_{Si}(1-P)^3}{n}$$

where E is the Young's modulus, P is porosity (e.g., 0.76), and n is an anisotropy factor. In one example, the Young's modulus of porous silicon (Si) structures can be equal to a value ranging from 10 GPa to 50 GPa. For comparison to the Young's modulus of porous silicon (Si), the Young's modulus of silicon germanium (SiGe) structures can range from 100 GPa to 170 GPa. Some examples of the percentage of relaxation provided by the interaction of an elastic porous semiconductor, such as the porous silicon (PS) core of a fin structure, with a solid semiconductor material having a lattice structure typically resulting in strain production can be provided from the following equation:

$$r = \frac{(1-v_{PS})E_{SiGe}h_{SiGe}}{(1-v_{PS})E_{SiGe} + (1-v_{SiGe})E_{PS}h_{PS}}$$

where r is % relaxation, E is the Young's modulus, v is Poisson's ratio, and h is thickness of the films. In one example, from the above described equations, for a layer of non-porous silicon germanium (SiGe) formed on a layer of porous silicon (PS) having substantially the same thickness as the layer of SiGe, 80% relaxation can be achieved in non-porous silicon germanium (SiGe). It is noted that this is only one example of the relaxation that can be provided by a fin structure having a porous core. Further details regarding the degree of relaxation that can be provided by a fin structure having a porous core will be described below with reference to FIGS. 1-8.

In addition to employing a fin structure having a porous core to provide a relaxed semiconductor material, such as silicon germanium (SiGe), the methods disclosed herein reduce the incidence of dislocation defect formation. For example, the relaxed semiconductor material, e.g., relaxed silicon germanium (SiGe), that is formed on the fin structure having the porous core may serve as the deposition surface for forming strained semiconductor materials having a low incidence of dislocation defects or being substantially free of dislocation defects. The methods and structures of the present disclosure are now described with greater detail referring to FIGS. 1-8.

Figure 1B:
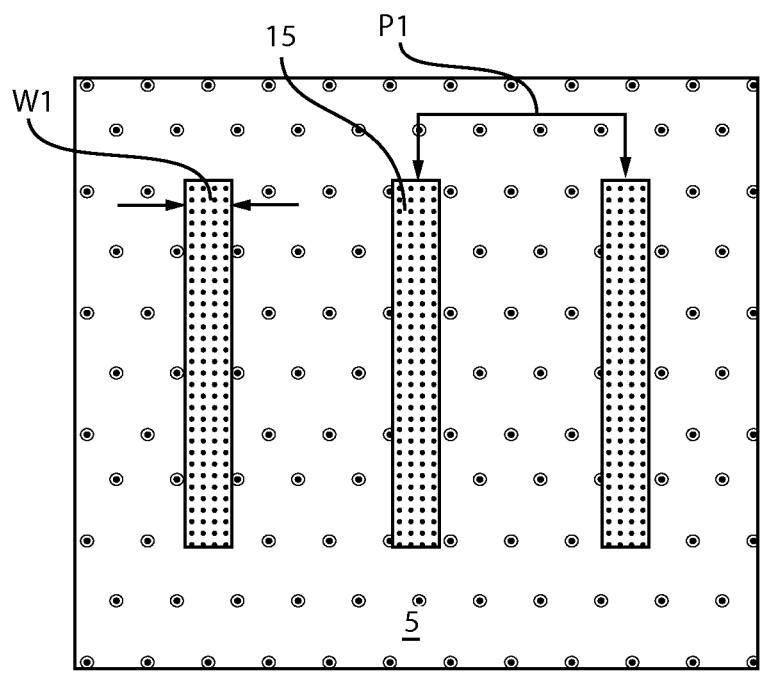
FIG. 1B is a top down view of the fin structures depicted in FIG. 1A, in which the cross-section of FIG. 1A is along section line A-A in FIG. 1B.

FIGS. 1A and 1B depict one embodiment of forming fin structures 15 of a first composition on a substrate 5 for producing a semiconductor device, such as a fin field effect transistor (FinFET). A "field effect transistor (FET)" is a semiconductor device in which the output current, i.e., source-drain current, is controlled by the voltage applied to the gate. A FET has three terminals, i.e., gate structure, source region and drain region. A gate structure is a structure used to control output current (i.e., flow of carriers in the channel) of a semiconducting device through electrical fields. A FinFET is a field effect transistor in which at least the channel portion of the field effect transistor is present in a fin structure. As used herein, a "fin structure" refers to a semiconductor material, which can be employed as the body of a semiconductor device, in which the gate structure is positioned around the fin structure such that charge flows down the channel on the two sidewalls of the fin structure and optionally along the top surface of the fin structure. The channel is the region underlying the gate structure and between the source and drain region of a semiconductor device that becomes conductive when the semiconductor device is turned on.

The fin structures 15 are typically formed from a semiconductor material layer that is present overlying a dielectric material layer 5. In some embodiments, the semiconductor material layer that provides the material of the fin structure 15 may be a semiconductor on insulator (SOI) layer, e.g., silicon on insulator layer, of a semiconductor on insulator (SOI) substrate. In this example, in which the fin structures are formed from the SOI layer of an SOI substrate, the dielectric material layer 5, e.g., silicon oxide ($SiO_2$) layer, may be provided by the buried insulating layer of the SOI substrate. In this example, a base semiconductor layer (not shown) of the SOI substrate may be present underlying the buried insulating layer. It is noted that it is not necessary that the fin structures 15 are formed using and SOI substrate. For example, bulk semiconductor substrates may also be used to form the fin structures 15.

The fin structures 15 of the first composition are typically formed from a silicon containing material. In some embodiments, the fin structures 15 may be composed of silicon (Si). For example, the fin structures 15 may be composed of single crystal silicon, polysilicon, microcrystalline silicon, and combinations therefore. In some embodiments, the fin structures may be composed of silicon alloyed with another element, such as carbon.

The first composition semiconductor material layer that provides the fin structures 15 may be doped to facilitate the formation of porosity in the later described anodization process that forms the porous core of the fin structure 15. In one embodiment, the dopant that is present in the first composition semiconductor material layer that promotes porosity formation during anodization may include at least one of boron (B), indium (In) and a combination thereof. In some embodiments, the dopant that is present in the first composition semiconductor material layer that provides for porosity formation in the fin structures 15 by anodization may be present in a concentration ranging from $1 \times 10^{17}$ atoms/cm$^3$ to $5 \times 10^{20}$ atoms/cm$^3$. In another example, the dopant that is present in the first composition semiconductor material layer that provides for porosity formation by anodization may be present in a concentration ranging from $5 \times 10^{17}$ atoms/cm$^3$ to $5 \times 10^{19}$ atoms/cm$^3$. In yet another example, the dopant that is present in the first composition semiconductor material layer for creating porosity during the later described anodization process may be present in the first composition semiconductor material layer in a concentration ranging from $1 \times 10^{18}$ atoms/cm$^3$ to $1 \times 10^{19}$ atoms/cm$^3$.

The dopant that is present in the first composition semiconductor material layer that provides for porosity formation by anodization may be introduced using an in-situ doping process or using ion implantation. By "in-situ" it is meant that the dopant is introduced as the material layer is being formed or deposited, e.g., during the epitaxial deposition process. For example, when doping a semiconductor material concurrently with the epitaxial growth process, a gas source for the dopant is introduced to the semiconductor material being grown simultaneously with the gas source that provides the precursor for epitaxially forming the semiconductor material. In-situ doping is differentiated from ion implantation that occurs after the semiconductor material has been formed. In one example, in which the dopant that is present in the first composition semiconductor material includes boron (B), the gaseous dopant sources for in-situ doping can include $B_2H_6$, $BCl_3$ and combinations thereof. In other embodiments, the dopant that is present in the first composition semiconductor material that provides for porosity formation by anodization may be introduced using ion implantation after the base material layer, i.e., first composition semiconductor material, for the fin structures 15 has been formed. In yet other embodiments, the dopant may be introduced by gas phase doping, or by depositing a doped layer and diffusing the dopant from the doped layer to the first composition semiconductor layer that provides the fin structures 15.

The fin structures 15 are typically formed using deposition, photolithography, i.e., patterning, and etch processes. In one embodiment, the patterning process used to define each of the fin structures 15 is a sidewall image transfer (SIT) process. The SIT process can include forming a mandrel material layer (not shown) on the material layer that provides the fin structures 15, such as the SOI layer of an SOI substrate. The mandrel material layer can include any material (semiconductor, dielectric or conductive) that can be selectively removed from the structure during a subsequently performed etching process. In one embodiment, the mandrel material layer may be composed of amorphous silicon or polysilicon. In another embodiment, the mandrel material layer may be composed of a metal, such as, e.g., aluminum (Al), tungsten (W), or copper (Cu). The mandrel material layer can be formed by a deposition method, such as chemical vapor deposition or plasma enhanced chemical vapor deposition. In one embodiment, the thickness of the mandrel material layer can be from 50 nm to 300 nm. Following deposition of the mandrel material layer, the mandrel material layer can be patterned by lithography and etching to form a plurality of mandrel structures on the topmost surface of the semiconductor containing material that provides the fin structures 15, e.g., the SOI layer of an SOI substrate.

In some embodiments, the SIT process may continue by forming a dielectric spacer on each sidewall of each mandrel structure. The dielectric spacer can be formed by deposition of a dielectric spacer material, and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, but are not limited to, chemical vapor deposition (CVD), plasma enhanced chemical vapor deposition (PECVD), or atomic layer deposition (ALD). Examples of etching that be used in providing the dielectric spacers include any etching process such as, e.g., reactive ion etching (RIE). Since the dielectric spacers are used in the SIT process as an etch mask, the width of the each dielectric spacer determines the width of each fin structure 15.

In some embodiments, after formation of the dielectric spacers, the SIT process continues by removing each mandrel structure. Each mandrel structure can be removed by an etching process that is selective for removing the mandrel material as compared to silicon. Following the mandrel structure removal, the SIT process continues by transferring the pattern provided by the dielectric spacers into the semiconductor material layer that provides the fin structures 15, such as the SOI layer of an SOI substrate. The pattern transfer may be achieved by utilizing at least one etching process that can include dry etching, such as reactive ion etching (RIE), plasma etching, ion beam etching or laser ablation, chemical wet etch processes or a combination thereof. In one example, the etch process used to transfer the pattern may include one or more reactive ion etching (RIE) steps. In some embodiments, the etch process may be an etch process including a chemistry that is selective to the dielectric layer 5 that is underlying the material layer that is patterned to provide the fin structures 15. The etching steps pattern the semiconductor material layer to provide the fin structures 15. Following etching, i.e., pattern transfer, the SIT process may conclude with removing the dielectric spacers using an etch process or a planarization process.

It is noted that the aforementioned spacer image transfer (SIT) process is only one method of forming the fin structures 15. In another embodiment, each of the fin structures 15 may be formed using a photoresist etch mask. Specifically, in one example, a photoresist mask is formed overlying the semiconductor composition layer which provides the fin structures 15. The exposed portions of the semiconductor layer that provides the fin structures 15 that are not protected by the photoresist mask are removed using a selective etch process. To provide the photoresist mask, a photoresist layer is first positioned on the semiconductor layer that provides the fin structure 15, e.g., SOI layer of an SOI substrate. The photoresist layer may be provided by a blanket layer of photoresist material that is formed utilizing a deposition process such as, e.g., plasma enhanced CVD (PECVD), evaporation or spin-on coating.

The blanket layer of photoresist material is then patterned to provide the photoresist mask utilizing a lithographic process that may include exposing the photoresist material to a pattern of radiation and developing the exposed photoresist material utilizing a resist developer. Following the formation of the photoresist mask, an etching process may remove the unprotected portions of the semiconductor layer that provides the fin structures 15 selectively to the underlying dielectric layer 5. The etch process may be an anisotropic process, such as reactive ion etch (RIE).

In some embodiments, each of the fin structures 15 may have a height H1 ranging from 5 nm to 200 nm. In another embodiment, each of the plurality of fin structures 15 has a height H1 ranging from 10 nm to 100 nm. In one example, each of the plurality of fin structures 15 has a height H1 ranging from 20 nm to 50 nm. Each of the plurality of fin structures 15 may have a width W1 of less than 20 nm. In another embodiment, each of the plurality of fin structures 15 has a width W1 ranging from 3 nm to 8 nm. Although three fin structures are depicted in FIGS. 1A and 1B, the present disclosure is not limited to only this example. It is noted that any number of fin structures 15 may be present in the plurality of fin structures 15. The pitch P1 separating adjacent fin structures in the plurality of fin structures 15 may range from 10 nm to 500 nm. In another example, the pitch P1 separating adjacent fin structures in the plurality of fin structures 15 may range from 20 nm to 50 nm.

Figure 2:
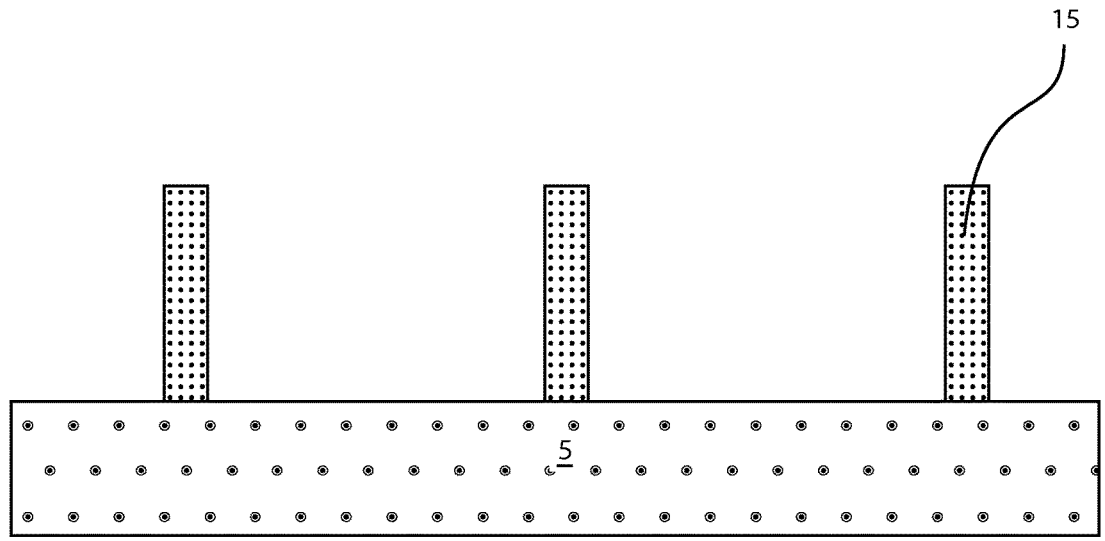
FIG. 2 is a side cross-sectional view depicting forming porosity in a first composition fin structure using an anodization process, in accordance with one embodiment of the present disclosure.

FIG. 2 depicts one embodiment of forming porosity in the fin structure 15 of the first composition using an anodization process. One embodiment of an anodization process that is suitable for forming porosity in the fin structure 15 includes immersing the structures depicted in FIGS. 1A and 1B including the fin structures 15 into an HF-containing solution, while an electrical bias is applied to the structure with respect to an electrode also placed in the HF-containing solution. In such a process, a supporting structure, such as the dielectric layer 3, can serve as the positive electrode of the electrochemical cell, while another semiconducting material, such as silicon (Si), or a metal is employed as the negative electrode. The term "HF-containing solution" includes concentrated HF (49%), a mixture of HF and water, a mixture of HF and a monohydric alcohol, such as methanol, ethanol, propanol, etc, or HF mixed with at least one surfactant. The amount of surfactant that is present in the HF solution is typically from 1% to 50%, based on 49% HF.

In some embodiments, the anodization process removes the doped portions of the first composition semiconductor material of the fin structures 15 to provide a series of voids, i.e., pores. In general, the HF anodization dissolves the silicon containing first composition semiconductor material that is been doped selectively to undoped portions of the silicon containing first composition material that provides the fin structures 15. The remaining portions of semiconductor material, e.g., silicon, of the fin structure 15 provide a matrix through which a dispersed phase of pores is present. The rate of removal may depend upon material properties, i.e., doping type and concentration, as well as the reaction conditions of the anodization process itself (current density, bias, illumination and additives in the HF-containing solution).

In one embodiment, the anodization process is performed using a constant current source that operates at a current density from 0.05 milliAmps/cm$^2$ to 50 milliAmps/cm$^2$. A light source may be optionally used to illuminate the sample. In another embodiment, the anodization process employed uses a constant current source operating at a current density from 0.1 milliAmps/cm$^2$ to 5 milliAmps/cm$^2$. The anodization process is typically performed at room temperature, e.g., 20° C. to 25° C., or a temperature that is elevated from room temperature or below room temperature may be used. For example, the temperature of the anodization process may range from 0° C. to 80° C. Following the anodization process, the structure is typically rinsed with deionized water and dried. Anodization typically occurs for a time period of less than about 10 minutes, with a time period of less than 1 minute being more typical.

In some embodiments, the pore size of the porosity provided by the above described anodization process may range from 0.5 nm to 15 nm in diameter. In other embodiments, the pore size of the porosity in the fin structure 15 may range from 1 nm to 10 nm in diameter. In yet another embodiment, the pore size of the porosity in the fin structure 15 may range from 3 nm to 6 nm in diameter. The porosity introduced to the fin structure 15 may occupy greater than 40% of the fin structure 15 by volume. In some examples, the volume occupied by the porosity in the fin structure 15 may be 45%, 50%, 55%, 60%, 65%, 70%, 75%, and 80%, as well as any range including one of the above mentioned values as the minimum of the range, and one of the above mentioned values as the maximum of the range. In some examples, the surface area provided by the porosity may be on the order of 10 cm$^2$/cm$^3$. In another embodiment, porous Si can be formed followed by fin formation.

Figure 3:
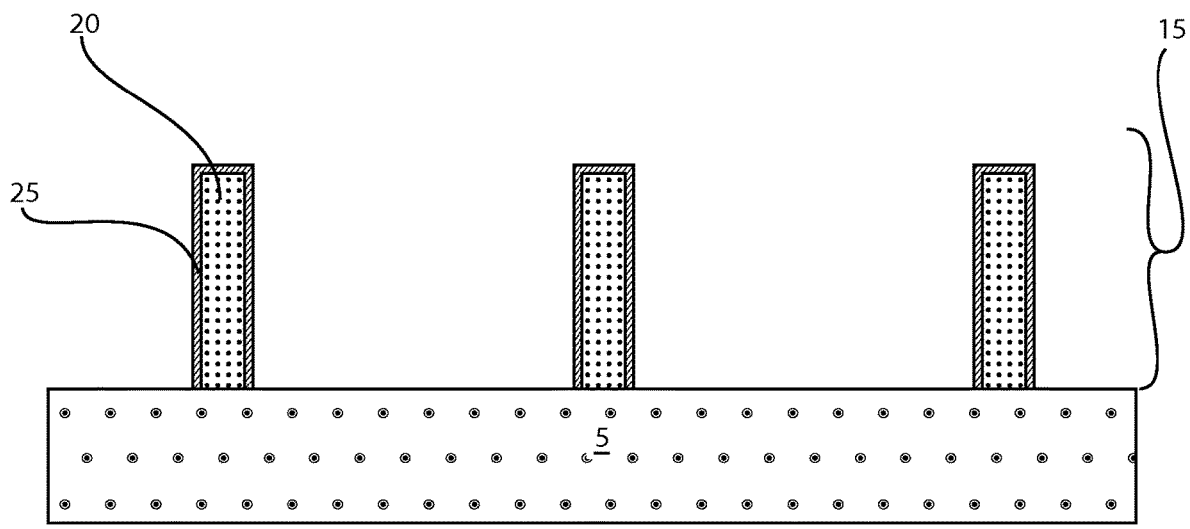
FIG. 3 is a side cross-sectional view depicting treating the first semiconductor composition fin structure with an anneal to produce a fin structure with a porous core and a first composition semiconductor outer layer, in accordance with one embodiment of the present disclosure.

FIG. 3 depicts treating the first semiconductor composition fin structure 15 with an anneal to produce a first composition semiconductor outer layer 25 on a fin structure 15 having a porous core 20. The first composition semiconductor outer layer 25 is formed from the semiconductor material of the fin structure 15. For example, the first composition semiconductor outer layer 25 may be composed of silicon (Si). The anneal process forms a thin outer layer of the first composition semiconductor material on the outer surface of the fin structure 15 that is substantially free of porosity so that the porous core 20 has a closed porosity from the ambient. The thin outer layer 25 may have a thickness ranging from 1 nm to 10 nm. In another embodiment, the thickness of the first composition semiconductor outer layer 25 may range from 2 nm to 4 nm. The first composition semiconductor outer layer 25 may be composed of silicon (Si), and first composition semiconductor outer layer 25 may have a lattice structure that would provide a deposition surface for later formed epitaxially deposited materials.

In one embodiment, the annealing process that forms the first composition semiconductor outer layer 25 is a hydrogen annealing process. In one embodiment, the hydrogen annealing process is performed in a hydrogen-containing atmosphere in which the hydrogen concentration is from about 1% to about 100%. By "hydrogen-containing atmosphere" it is meant an ambient that includes hydrogen atoms. In some embodiments, the hydrogen-containing atmosphere further includes He, Ar, N$_2$ or mixtures thereof.

In some embodiments, the thermal annealing, particularly, the hydrogen thermal anneal, is performed at a temperature up to 800° C. In yet another embodiment, the thermal annealing temperature is from about 600° to about 800° C. The duration of the thermal anneal employed in the present disclosure may vary, depending on the annealing temperature and hydrogen pressure. Typically, however, the thermal annealing step is performed for a duration ranging from a few seconds to 1 hour. More typically, the duration of the thermal anneal employed in creating the first composition semiconductor outer layer 25 is from about 1 min to about 10 minutes.

Figure 4:
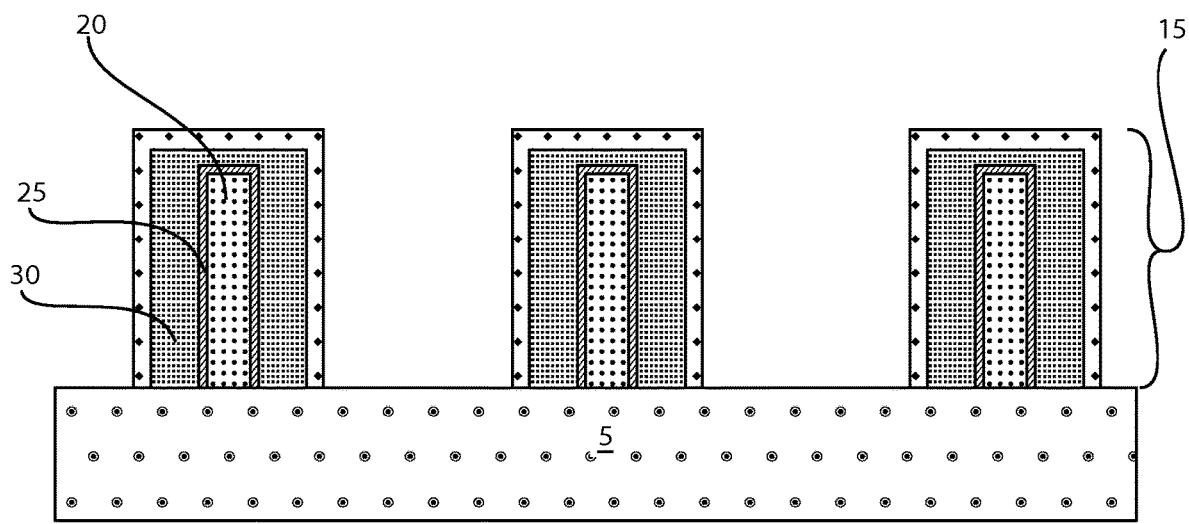
FIG. 4 is a side cross-sectional view depicting one embodiment of forming a second composition semiconductor layer on the first composition semiconductor outer layer of the fin structure with the porous core, wherein the strain in the second semiconductor composition is relaxed by the elasticity of the porous core.

FIG. 4 depicts one embodiment of forming a second composition semiconductor layer 30 on the first composition semiconductor outer layer 25 of the fin structure 15 with the porous core 20, wherein the strain in the second composition semiconductor layer 30 is relaxed by the elasticity of the porous core 20. In some embodiments, the second composition semiconductor layer 30 is composed of a silicon (Si)

and germanium (Ge) composition, such as silicon germanium (SiGe). The germanium content of the second composition semiconductor layer 30 may range from 5% to 70%, by atomic weight %. In some embodiments, the germanium (Ge) content of the second composition semiconductor layer 30 may be greater than 20 at. %. In other embodiments, the germanium (Ge) content of the second composition semiconductor layer 30 ranges from 20 at. % to 100 at. %. In another embodiment, the germanium content of the second composition semiconductor layer 30 may range from 10% to 40%. In one example, the second composition semiconductor layer 30 may be pure germanium (Ge). Examples of materials suitable for the second composition semiconductor layer 30 include germanium (Ge), crystalline germanium, single crystal germanium, multicrystalline germanium, silicon germanium doped with carbon (SiGe:C), hydrogenated silicon germanium and combinations thereof.

In some embodiments, the second composition semiconductor layer 30 is formed on the sidewalls and upper surface of each fin structure 15, wherein the second composition semiconductor layer 30 is formed directly on the first composition semiconductor outer layer 25. In one embodiment, forming the second composition semiconductor layer 30 on the first composition semiconductor outer layer 25 of the fin structure 25 includes epitaxially deposition/epitaxial growth. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, an epitaxial film deposited on a {100} crystal surface will take on a {100} orientation. A number of different sources may be used for the epitaxial deposition of a second composition semiconductor layer 30 comprised of silicon (Si) and germanium (Ge). In some embodiments, the gas source for the deposition of an epitaxial germanium second composition semiconductor layer 30 may include a germanium including gas sources. For example, the second composition semiconductor layer 30 may be deposited from a germanium gas source that is selected from the group consisting of germane, digermane, halogermane, dichlorogermane, trichlorogermane, tetrachlorogermane and combinations thereof. In some embodiments, the germanium including gas source may be accompanied by a silicon including source gas that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. The temperature for epitaxial silicon germanium deposition typically ranges from 450° C. to 900° C. Although higher temperature typically results in faster deposition, the faster deposition may result in crystal defects and film cracking. The epitaxially deposited second composition semiconductor layer 30 may be a conformally deposited layer. The term "conformal" denotes a layer having a thickness that does not deviate from greater than or less than 30% of an average value for the thickness of the layer.

Typically, an epitaxially deposited semiconductor layer having a lattice dimension that differs from the lattice dimension of the deposition surface, such as the present case in which a larger lattice dimension silicon (Si) and germanium (Ge) containing second composition layer 30, e.g., SiGe second composition layer, is formed on a smaller lattice dimension first composition semiconductor outer layer 25 of silicon (Si), a strain will be formed in the epitaxially deposited layer. That strain may result in the eventual formation of dislocation defects, when the epitaxially deposited material is deposited to increasing thicknesses. The greater the difference in lattice dimension between the epitaxially deposited material and the deposition surface, the greater the degree of dislocation formation.

In some embodiments, the methods and structures of the present disclosure overcome the aforementioned strain effects and incidence of dislocation defects with the porous core 20 of the fin structure 15. The porous core 20 of the fin structure 15 is an elastic body that allows for relaxation of the strain that is formed in epitaxially deposited semiconductor materials, e.g., second composition semiconductor layer 30, having a different lattice dimension than the deposition surface that the epitaxial material is deposited on. For example, the elastic modulus of porous silicon (PS), as employed in the porous core 20 of the fin structure 15 is three times (3×) to four times (4×) lower than nonporous SiGe or Si, a nonporous silicon germanium (SiGe) layer, as in the silicon (Si) and germanium (Ge) containing second composition layer 30. If the thickness of the silicon (Si) and germanium (Ge) containing second composition layer 30 is similar, e.g., equal to, or greater than the thickness of the porous core 20, e.g., porous silicon (PS) core, of the fin structure 15, the strain in the silicon (Si) and germanium (Ge) containing second composition layer 30 may be relaxed. In some embodiments, the thickness of the silicon (Si) and germanium (Ge) containing second composition layer 30 may range from 2 nm to 40 nm. In another embodiment, the thickness of the silicon (Si) and germanium (Ge) containing second composition layer 30 may range from 3 nm to 10 nm.

In some embodiments, the strain in the second composition semiconductor layer 30 may be relaxed up to 70% by the porous core 20 if the fin structure 15, in comparison to a fin structure having a solid core and the same chemical composition. In other embodiments, the strain in the second composition semiconductor layer 30 may be relaxed up to 70% by the porous core 20 of the fin structure 15, in comparison to a fin structure having a solid core and the same chemical composition. In some examples, the strain in the second composition semiconductor layer 30 may be relaxed by the porous core 20 to a value of 70%, 75%, 80%, 85%, 90%, 95% and 100%, as well as any range including one of the above mentioned values as the minimum of the range, and one of the above mentioned values as the maximum of the range.

The elastic nature of the porous core 20 of the fin structure 15 also reduces, and in some embodiments can eliminate, the incidence of defects, such as dislocation defects, in the second composition semiconductor layer 30, e.g., SiGe second composition semiconductor layer 30, that is epitaxially formed on the fin structure 10, e.g., silicon fin structure 15. In some embodiments, the maximum amount of dislocation defects formed in the second composition semiconductor layer 30 may be no greater than 1000 defects/cm². In another embodiment, the maximum amount of dislocation defects formed in the second composition semiconductor layer 30 may be no greater than 10 defects/cm². In one example, the presence of dislocation defects formed in the second composition semiconductor layer 30 may be entirely eliminated, i.e., the second composition semiconductor layer 30 is dislocation defect free.

In some embodiments, FinFET semiconductor devices may be formed using the relaxed and substantially dislocation defect free fins having the second composition semiconductor layer 30, e.g., relaxed and substantially dislocation defect free silicon germanium (SiGe), that can be formed using the process sequence that is described above with reference to FIGS. 1-4. For example, the relaxed and substantially dislocation defect free fins having the second composition semiconductor layer 30, e.g., relaxed and substantially dislocation defect free silicon germanium (SiGe), may be suitable for p-type semiconductor devices, such as p-type FinFETs (p-FinFETs). P-type semiconductor devices typically include source and drain regions doped with a p-type dopant. As used herein, the term "source region" is a doped region in the semiconductor device, in which majority carriers are flowing into the channel. As used herein, the term "drain region" means a doped region in semiconductor device located at the end of the channel, in which carriers are flowing out of the transistor through the drain. As used herein, "p-type" refers to the addition of impurities to an intrinsic semiconductor that creates deficiencies of valence electrons. In a type IV semiconductor material, such as a silicon-containing material and/or a silicon and germanium containing material, examples of p-type dopants, i.e., impurities, include but are not limited to: boron, aluminum, gallium and indium.

Figure 5A:
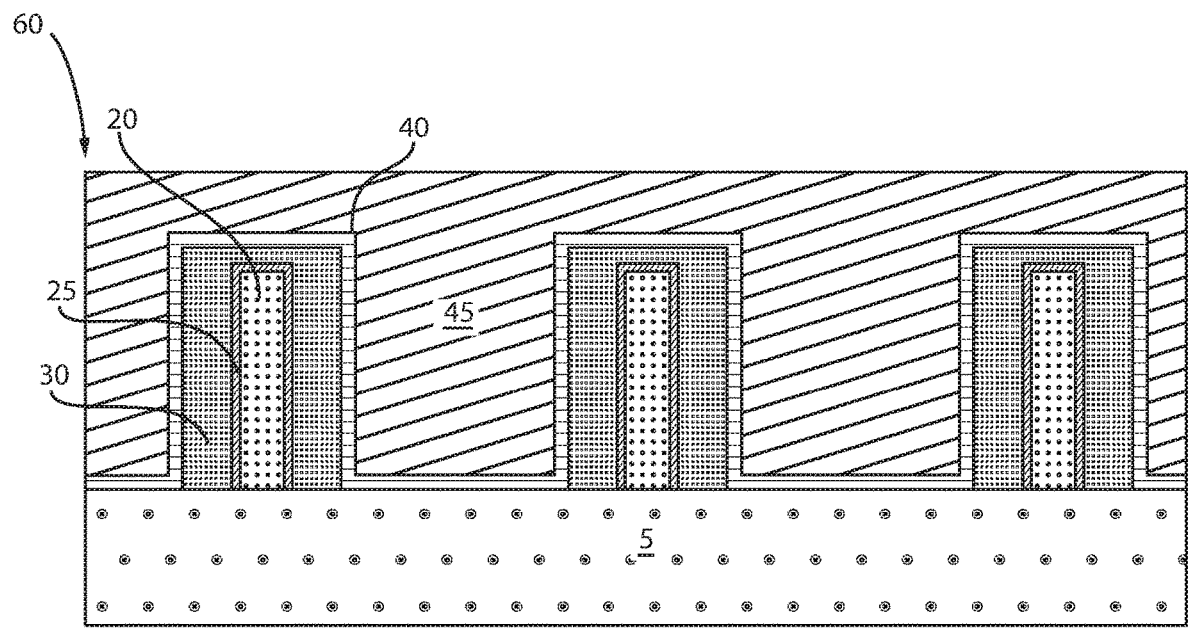
FIG. 5A is a side cross-sectional view depicting forming a gate structure on the fin structure including the porous core and the relaxed second semiconductor composition layer, in accordance with one embodiment of the present disclosure.
Figure 5B:
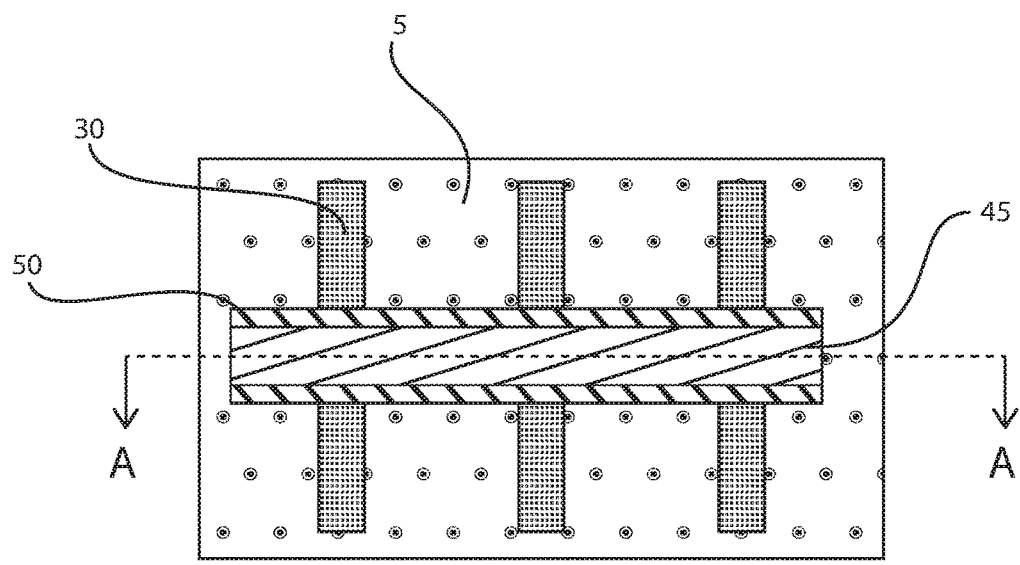
FIG. 5B is a top down view depicting the structure depicted in FIG. 5A, in which the cross section of FIG. 5A is along section line A-A in FIG. 5B.

Referring to FIGS. 5A and 5B, the formation of a p-type semiconductor device, e.g., p-FinFET, using the fin structure 15 depicted in FIG. 4 may include forming a gate structure 60. The "gate structure" functions to switch the semiconductor device from an "on" to "off" state, and vice versa. The gates structure 60 is formed on the channel region of the fin structures 15. The gate structure 60 typically includes at least a gate dielectric 40 that is present on the channel region of the fin structure 15, and a gate electrode 45 that is present on the gate dielectric 40. It is noted that the fin structure 15 depicted in FIG. 5A does not depict every layer depicted in FIG. 4 for the purposes of clarity in drafting the perspective view.

In one embodiment, the at least one gate dielectric layer 40 includes, but is not limited to, an oxide, nitride, oxynitride and/or silicates including metal silicates, aluminates, titanates and nitrides. In one example, when the at least one gate dielectric layer 40 is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the at least one gate dielectric layer 40 may vary, but typically, the at least one gate dielectric layer 40 has a thickness from 1 nm to 10 nm. In another embodiment, the at least one gate dielectric layer 50 has a thickness from 1 nm to 3 nm.

The conductive material of the gate electrode 45 may comprise polysilicon, SiGe, a silicide, a metal or a metal-silicon-nitride such as Ta—Si—N. Examples of metals that can be used as the gate electrode 45 include, but are not limited to, Al, W, Cu, and Ti or other like conductive metals. The layer of conductive material for the gate electrode 45 may be doped or undoped. If doped, an in-situ doping deposition process may be employed. Alternatively, a doped conductive material can be formed by deposition, ion implantation and annealing. In yet another embodiment, when the fin structure 15 is being employed in a p-FinFET, the gate electrode may be composed of a p-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. In one embodiment, the p-type work function metal layer may be composed of titanium and their nitrided/carbide. In one embodiment, the p-type work function metal layer is composed of titanium nitride (TiN). The p-type work function metal layer may also be composed of TiAlN, Ru, Pt, Mo, Co and alloys and combinations thereof.

The gate structure 60 may be formed by using a deposition method, such as a chemical vapor deposition method and/or a physical vapor deposition (PVD), to deposit the material layers for the at least one gate dielectric layer 40 and the at least one gate electrode 45 followed by photolithography and etch processing.

Referring to FIG. 5B, in some embodiments, a gate sidewall spacer 50 can be formed on the sidewall of the gate structure 60. In one embodiment, the gate sidewall spacer 50 may be formed by using a blanket layer deposition process, such as CVD, and an anisotropic etchback method. The gate sidewall spacer 50 may have a width ranging from 2.0 nm to 15.0 nm, and may be composed of a dielectric, such as a nitride, oxide, oxynitride, or a combination thereof.

Figure 6:
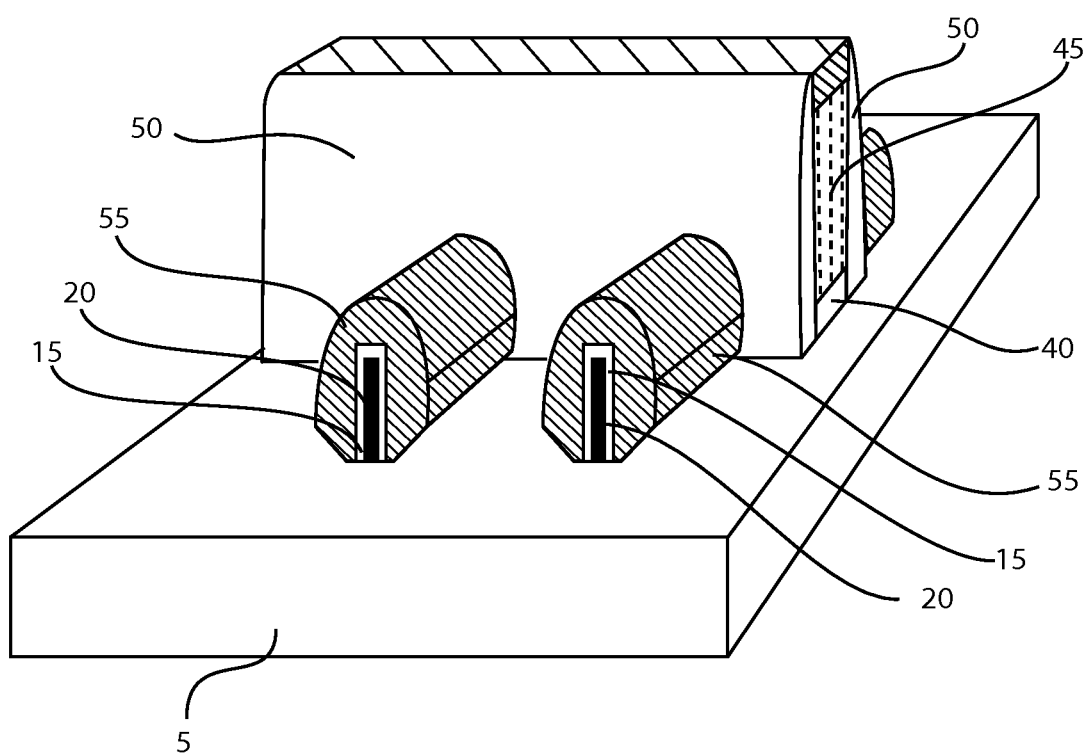
FIG. 6 is a perspective view of FinFET devices including fin structures with a porous core, in accordance with some embodiments of the present disclosure.

FIG. 6 depicts one embodiment of forming source and drain regions 55 on the source and drain region portions of the fin structure 15 that are present on opposing sides of the fin structure's channel region. In this embodiment, in which the second composition semiconductor layer 30 that provides the outer surface of the fin structures 15 is composed of substantially relaxed and substantially silicon (Si) and germanium (Ge) containing semiconductor material, the source and drain regions 55 may have a p-type conductivity to provide a p-FinFET. In some embodiments, forming the source and drain regions 55 may include epitaxially forming in situ doped source and drain semiconductor material, such as silicon and germanium containing material, e.g., SiGe, on the source and drain region portions of the fin structures 15. The term "in-situ" as used to describe the dopant that provides the conductivity type of the source and drain semiconductor material means that the dopant, e.g., p-type dopant, that dictates the conductivity type of the epitaxially formed in situ doped source and drain semiconductor material is introduced during the process step, e.g., epitaxial deposition, which forms the in situ doped source and drain semiconductor material.

In some embodiments, extension source and drain regions may be formed after the epitaxially formed in situ doped source and drain semiconductor material are positioned on the source and drain region portions of the fin structures 15 by thermally diffusing the p-type dopant from in situ doped source and drain semiconductor material into the underlying portion of the fin structures 15. Ion implantation may also be used to dope the source and drain regions of the device. In some embodiments, the source and drain regions are activated by a high temperature anneal, while the replacement gate structure 25 is present in the structure.

Figure 8A:
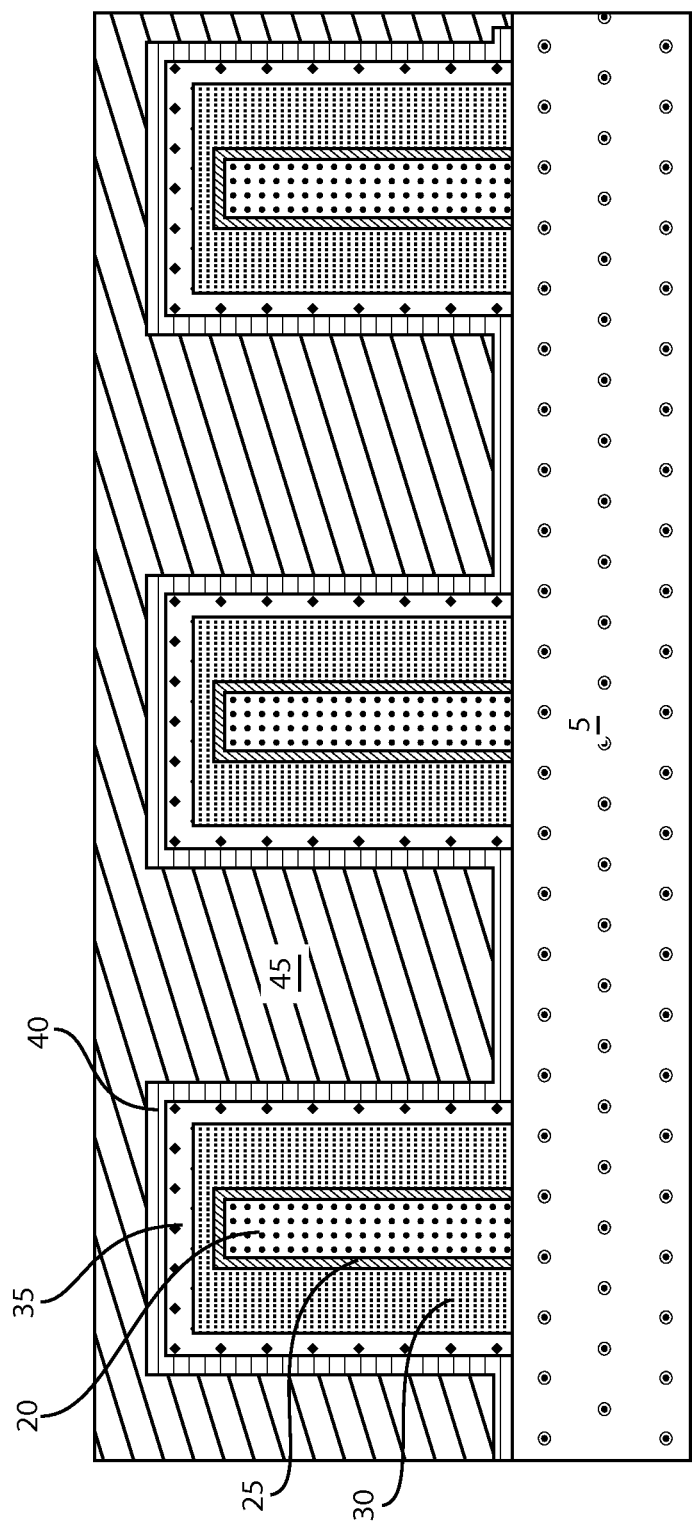
FIG. 8A is a side cross-sectional view depicting forming a gate structure on the channel region of the fin structure depicted in FIG. 7 including the third composition strained semiconductor layer and the porous core, in accordance with one embodiment of the present disclosure.
Figure 8B:
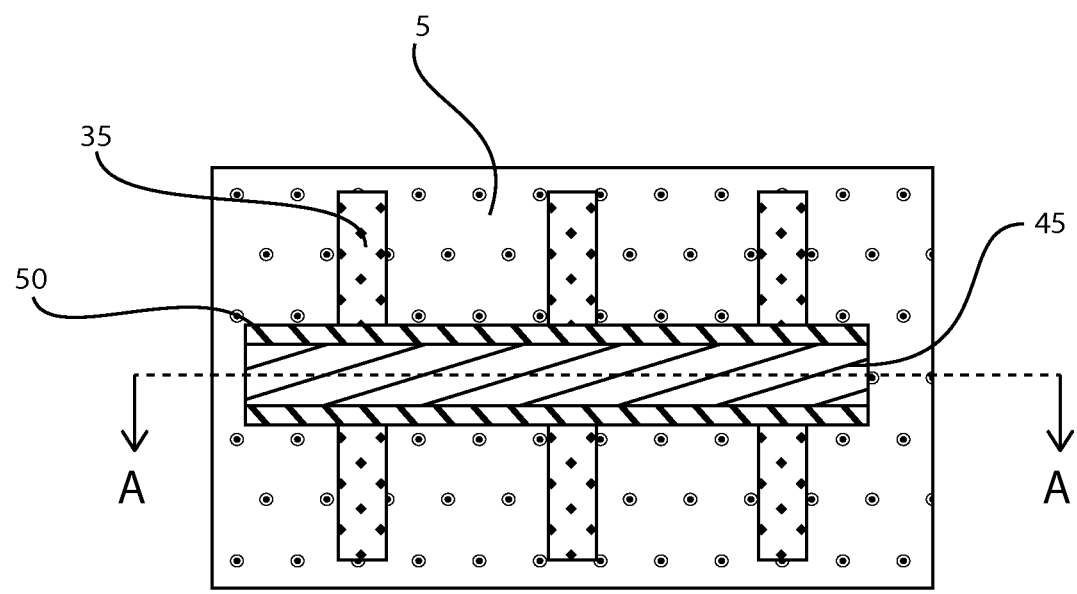
FIG. 8B is a top down view of the structure depicted in FIG. 8A, in which the cross section of FIG. 8A is along section line A-A in FIG. 8B.

FIGS. 7-8B illustrates some other embodiments of the present disclosure, in which the relaxed and substantially defect free second composition semiconductor layer 30 including silicon (Si) and germanium (Ge), e.g., silicon germanium (SiGe), can be used as the deposition surface for epitaxially forming strained semiconductor material layers suitable for carrier speed enhancements in p-type and n-type semiconductor devices, e.g., p-type FinFETs (p-FinFETs) and n-type FinFETs (n-FinFETs).

FIG. 7 depicts one embodiment of the present disclosure in which a third composition strained semiconductor layer 35 that is substantially free of defects is formed on the second composition semiconductor layer 30. In one embodiment, the third composition strained semiconductor layer 35 is composed of an epitaxially formed semiconductor material having a greater lattice dimension than the lattice dimension of the semiconductor material of the relaxed second composition semiconductor layer 30. This can provide that the epitaxially formed third composition strained semiconductor layer 35 has a compressive strain, which is suitable for carrier speed enhancements in p-type semiconductor devices. For example, in one embodiment the third composition strained semiconductor layer 35 is formed using an epitaxial deposition process on a relaxed second composition semiconductor layer of silicon germanium (SiGe), wherein the third composition semiconductor layer 35 comprises silicon (Si) and germanium (Ge) with a greater germanium (Ge) concentration than the germanium (Ge) concentration in the relaxed second composition semiconductor layer 30. For example, the germanium concentration (Ge) in the third composition strained semiconductor layer 35 may range from 15% to 30%, while the germanium concentration in the second composition semiconductor layer 30 may range from 30% to 70%. In some examples, the compressive strain produced in the third composition strained layer 35 may range from 0.5% to 2%.

The third composition strained semiconductor layer 35 may be formed using an epitaxial deposition process similar to the epitaxial deposition process that has been described above with respect to forming the second composition semiconductor layer 30, in which the precursor gasses may be adjusted to adjust the composition of the material being deposited. For example, the silicon (Si) and germanium (Ge) precursor gasses may be adjusted to provide that the third composition strained semiconductor layer 35 has a greater germanium (Ge) content than the second composition semiconductor layer 30.

The thickness of the third composition strained semiconductor layer 35 is selected to be below its critical thickness to ensure that the strain formed therein does not induce defects. For example, the third composition strained semiconductor layer 35 may have a thickness ranging from 2 nm to 15 nm. In another example, the third composition strained semiconductor layer 35 may have a thickness ranging from 3 nm to 10 nm.

In some embodiments, the maximum amount of dislocation defects formed in the third composition strained semiconductor layer 35 of silicon germanium (SiGe) may be no greater than 1000 defects/cm$^2$. In another embodiment, the maximum amount of dislocation defects formed in the third composition strained semiconductor layer 35 of silicon germanium (SiGe) may be no greater than 10 defects/cm$^2$. In one example, the presence of dislocation defects formed in the third composition strained semiconductor layer 35 may be entirely eliminated, i.e., the third composition semiconductor layer 35 is dislocation defect free.

FIGS. 8A and 8B depict forming a gate structure 60 on the channel region of the fin structure 15 depicted in FIG. 7 including the third composition strained semiconductor layer 35, the relaxed second composition semiconductor layer 30, the first composition semiconductor outer layer 25 and the porous core 20. In some embodiments, the gate structure 60 depicted in FIGS. 8A and 8B is formed directly on the third composition strained semiconductor layer 35. It is noted that the fin structure 15 depicted in FIG. 8A does not depict every layer depicted in FIG. 7 for the purposes of clarity in drafting the perspective view.

The gate structure 60 including the gate dielectric 40 and the gate conductor 45, as well as the gate sidewall spacer 50 that are depicted in FIGS. 8A and 8B are similar to the gate structure 60 and gate sidewall spacer 50 that are depicted in FIGS. 5A and 5B. Therefore, the above description of the gate structure 60 and the gate sidewall spacer 50 describing the structures depicted in FIGS. 5A and 5B are suitable for describing the gate structure 60 and the gate sidewall spacer 50 that are depicted in FIGS. 8A and 8B.

Following the formation of the gate structure 60, source and drain regions structures may be formed on the source and drain region portions of the fin structure 15 on opposing sides of the channel region of the fin structure 15. The source and drain region structures may include in-situ doped epitaxial semiconductor material, such as epitaxial silicon germanium (SiGe), as well as extension regions. In the embodiments, in which the third composition strained semiconductor layer 35 is comprised of compressively strained semiconductor material, the source and drain region structures may be doped to a p-type conductivity. Further details regarding forming source and drain region structures that are formed on the fin structure 15 having the third composition strained semiconductor layer 35 composed of compressively strained semiconductor material are provided by the description of the source and drain region structures depicted in FIG. 6.

Referring to FIGS. 7-8B, in another embodiment, the third composition strained semiconductor layer 35 is composed of an epitaxially formed semiconductor material having a lesser lattice dimension than the lattice dimension of the semiconductor material of the relaxed second composition semiconductor layer 30. This can provide that the epitaxially formed third composition strained semiconductor layer 35 has a tensile strain, which is suitable for carrier speed enhancements in n-type semiconductor devices. In some examples, the tensile strain produced in the third composition strained layer 35 may range from 0.5% to 2%.

Similar to the embodiment described above, in which the third composition strained semiconductor layer 35 is composed of an epitaxial material having a greater lattice dimension than the lattice dimension of the semiconductor material of the deposition surface, the third composition strained semiconductor layer 35 having a lesser lattice dimension than the deposition surface may be substantially defect free, e.g., substantially dislocation defect free. For example, the maximum amount of dislocation defects formed in the third composition semiconductor layer 35 of silicon (Si) may be no greater than 1000 defects/cm$^2$. In one example, the presence of dislocation defects formed in the third composition semiconductor layer 35 may be entirely eliminated, i.e., the silicon (Si) third composition semiconductor layer 35 is dislocation defect free. The tensile strained third composition strained semiconductor layer 35, e.g., third strained semiconductor layer 35 or silicon (Si), may be formed using an epitaxial deposition process similar to the epitaxial deposition process that has been described above with respect to forming the second composition semiconductor layer 30.

The thickness of the third composition strained semiconductor layer 35 having a lesser lattice dimension than its deposition surface may be selected to be below its critical thickness to ensure that the strain formed therein is not relaxed. For example, the third composition strained semiconductor layer 35 of silicon (Si) may have a thickness ranging from 2 nm to 15 nm. In another example, the third composition strained semiconductor layer 35 if silicon (Si) may have a thickness ranging from 3 nm to 10 nm.

Following the formation of the third composition strained semiconductor layer 35 having the lattice dimension that is less than the deposition surface, a gate structure and source and drain region structures may be formed in accordance with semiconductor device processing for forming a Fin-FET. Typically, when the third composition strained semiconductor layer is composed of silicon (Si), which is epitaxially formed on a relaxed second composition semiconductor layer 30 composed of silicon and germanium, e.g., (SiGe), an n-type FinFET (n-FinFET) may be formed. Some examples of forming gate structures 60 suitable for use with a fin structure 15 including a third composition strained semiconductor layer 35 of tensile strained silicon (Si) have been described above with reference to FIGS. 5A-5B and 8A-8B. In some embodiments, the gate structure 60 may include an n-type work function metal layer. An "n-type work function metal layer" is a metal layer that effectuates an n-type threshold voltage shift. In one embodiment, the work function of the n-type work function metal layer ranges from 4.1 eV to 4.3 eV. In some embodiments, the n-type work function metal layer is composed of at least one of TiAl, TaN, TiN, HfN, HfSi, or combinations thereof.

Some examples of forming source and drain region structures 55 suitable for use with a fin structure 15 including a third composition strained semiconductor layer 35 of tensile strained silicon (Si) have been described above with reference to FIG. 6 with the exception that the source and drain region structures 55 are doped to an n-type conductivity when the third composition strained semiconductor layer 35 is of tensile strained silicon (Si). As used herein, "n-type" refers to the addition of impurities that contributes free electrons to an intrinsic semiconductor. N-type conductivity semiconductor devices are typically produced within silicon containing material by doping the source extension regions and the drain extension regions with elements from group V-A of the Periodic Table of Elements. In a silicon containing fin structure, examples of n-type dopants, i.e., impurities, include but are not limited to, antimony, arsenic and phosphorous. In some embodiments, the n-type source and drain region structures may include in-situ doped epitaxial semiconductor material, such as epitaxial silicon (Si), as well as extension regions.

It is noted that in the above examples, a gate first process has been described for forming the gate structure 60. The methods and structures of the present disclosure are not limited to only this process flow, as gate last processing is also suitable for use with the present disclosure. A gate last process can include forming a replacement gate structure on the channel portion of the fin structures, forming a spacer on the sidewall of the replacement gate structure, forming source and drain regions on opposing sides of the replacement gate structure, removing the replacement gate structure, and forming a functional gate structure in the space once occupied by the replacement gate structure. The replacement gate structure can include sacrificial material that defines the geometry of a later formed functional gate structure that functions to switch the semiconductor device from an "on" to "off" state, and vice versa. A process sequence employing a replacement gate structure may be referred to as a "gate last" process sequence. Both gate first and gate last process sequences are applicable to the present disclosure.

It is also noted that although n-type and p-type devices, e.g., n-FinFETs and p-FinFETs, have been described above individually, the n-type and p-type devices disclosed herein can also be formed together on the same substrate. For example, a first portion of the fin structures in a first region of a substrate can be processed to provide n-FinFETs, and a second portion of the fin structures in a second region of the substrate can be processed to provide p-FinFETs. The independent processing to provide the separate p-type and n-type conductivity devices may be provided by employing block masks, such as a photoresist block masks, to independently process specific regions of the substrate and independently protect specific regions of the substrates. Any combinations of the above described devices may be integrated onto the same substrate.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor device comprising;
a fin structure with at least one fin having a doped porous core of a first composition semiconductor material and an undoped substantially non-porous outer layer on three sides, wherein the doped porous core provides a compliant body and comprises pores that are voids in the first composition semiconductor material, the fin structure encapsulated on the three sides in a single outer surface layer of a second composition semiconductor material that is free of porosity to provide that the doped porous core has a closed porosity from the ambient;
a gate structure on a channel region portion of the fin structure; and
source and drain regions present on opposing sides of the gate structure.

2. The semiconductor device of claim 1, wherein the fin structure is comprised of the first composition semiconductor material including a silicon-containing semiconductor material.

3. The semiconductor device of claim 1, wherein the second composition semiconductor material includes a relaxed semiconductor layer present on the undoped substantially non-porous outer layer of the first composition semiconductor material of the fin structure.

4. The semiconductor device of claim 1, wherein the second composition semiconductor material comprises silicon and germanium, and the first composition semiconductor material comprises a silicon-containing semiconductor material.

5. The semiconductor device of claim 4, wherein the source and drain regions are doped to a p-type conductivity.

6. The semiconductor device of claim 1, wherein the fin structure includes an anodized fin structure.

7. The semiconductor device of claim 1, wherein the doped porous core is formed by anodization of a doped fin structure including the first composition semiconductor material using at least one of boron and indium and a nonporous outer surface is formed over the doped porous core based on anneal of the first composition semiconductor material.

8. The semiconductor device of claim 1, wherein the voids in the first composition semiconductor material range from 0.5 nm to 15 nm in diameter with the doped porous core having porosity within a range from 45% to 80% by volume.

* * * * *